United States Patent
Tanaka et al.

(10) Patent No.: US 7,851,803 B2
(45) Date of Patent: Dec. 14, 2010

(54) SEMICONDUCTOR DEVICE, MANUFACTURING METHOD OF SEMICONDUCTOR DEVICE, AND DISPLAY DEVICE

(75) Inventors: Atsushi Tanaka, Ashigarakami-gun (JP); Ken-Ichi Umeda, Ashigarakami-gun (JP); Kohei Higashi, Ashigarakami-gun (JP); Maki Nangu, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 61 days.

(21) Appl. No.: 12/418,671

(22) Filed: Apr. 6, 2009

(65) Prior Publication Data

US 2009/0250694 A1 Oct. 8, 2009

(30) Foreign Application Priority Data

Apr. 4, 2008 (JP) ............................. 2008-098346

(51) Int. Cl.
*H01L 29/10* (2006.01)
(52) U.S. Cl. .................. 257/66; 257/72; 257/E21.114; 257/E21.414; 257/E21.464; 438/151
(58) Field of Classification Search .................. 257/66, 257/72, E21.114, E21.414, E21.464; 438/151
See application file for complete search history.

(56) References Cited

U.S. PATENT DOCUMENTS

| 6,583,776 | B2* | 6/2003 | Yamazaki et al. ............. 345/77 |
| 2006/0055314 | A1* | 3/2006 | Nakamura et al. .......... 313/500 |
| 2007/0057261 | A1 | 3/2007 | Jeong et al. |
| 2009/0027580 | A1* | 1/2009 | Kurokawa et al. ............ 349/43 |
| 2009/0102360 | A1* | 4/2009 | Kawakami et al. .......... 313/504 |

FOREIGN PATENT DOCUMENTS

| JP | 2003-508807 A | 3/2003 |
| JP | 2007-81362 A | 3/2007 |
| JP | 2007-088001 A | 4/2007 |
| WO | 01/17029 A1 | 3/2001 |

* cited by examiner

*Primary Examiner*—Trung Dang
(74) *Attorney, Agent, or Firm*—Sughrue Mion, PLLC

(57) ABSTRACT

A semiconductor device includes a substrate and a channel region which is formed above the substrate by printing, wherein a relationship $L \geq 2a$ is satisfied where L is a channel length of the channel region and a is a minimum dimension among pattern dimensions and inter-pattern dimensions in the same layer as patterns that define the channel length L; and a relationship $W \geq 2b$ is satisfied where W is a channel width of the channel region and b is a minimum dimension among pattern dimensions and inter-pattern dimensions in the same layer as a pattern that defines the channel width W.

25 Claims, 5 Drawing Sheets

FORMATION OF GATE ELECTRODE

FORMATION OF GATE INSULATING FILM

FORMATION OF SEMICONDUCTOR LAYER

FORMATION OF SOURCE/DRAIN ELECTRODE PATTERNS

FORMATION OF INTERLAYER INSULATING FILM

FORMATION OF PIXEL ELECTRODE

SEMICONDUCTOR DEVICE, MANUFACTURING METHOD OF SEMICONDUCTOR DEVICE, AND DISPLAY DEVICE

CROSS-REFERENCE TO RELATED APPLICATIONS

This application claims the benefit of Japanese Patent Application JP 2008-098346, filed Apr. 4, 2008, the entire content of which is hereby incorporated by reference, the same as if set forth at length.

FIELD OF THE INVENTION

The present invention relates to a semiconductor device having a thin-film semiconductor layer and a manufacturing method of such a semiconductor device. More particularly, the invention relates to a semiconductor device suitable for light-transmission-type displays and bottom-emission-type light emission displays, a manufacturing method of such a semiconductor device, and a display device using such a semiconductor device.

BACKGROUND OF THE INVENTION

TFTs (thin-film transistors) are used as switching elements in active-matrix-driven panels such as LCDs (liquid crystal displays). The most common method for forming the semiconductor layer of TFTs is a method of patterning, by photolithography, an amorphous silicon film formed by CVD. Whereas the mobility of amorphous silicon is about 0.5 cm$^2$/V·s, in recent years TFTs using oxide semiconductors whose mobility values are as high as 10 cm$^2$/V·s have been being developed.

Semiconductor materials commonly used for TFTs, such as amorphous silicon, have as small band gaps as about 1 eV and are not transparent (i.e., have absorptions in the visible range). In contrast, in general, oxide semiconductors have as large band gaps as 3 eV and are transparent (i.e., have no absorptions in the visible range). In JP-A-2007-81362 (corresponding to US2007/0057261A1), for example, these features are utilized to increase the aperture ratio and the resolution of a display.

SUMMARY OF THE INVENTION

Incidentally, TFTs are required to be further reduced in manufacturing cost and studies on organic semiconductors which can be formed by a printing technology such as ink-jet printing are being made extensively. However, in general, organic semiconductors exhibit as low mobility as 0.01 to 0.1 cm$^2$/V·s. To obtain a sufficient drive current, the ratio W/L of the channel width W to the channel length L needs to be set large. To form a device in a limited space of a pixel region, the dimension L it set as small as possible. In printing technologies which are not suitable for microprocessing, the dimension L is necessarily set close to a minimum pattern dimension. As a result, the dimension L is affected to a large extent by the pattern accuracy. Such variations in device dimensions vary the drain current to a very large extent, which is room for improvement.

In conventional organic semiconductors, the device forming area is large and hence no region to transmit light can be secured. Therefore, the application range of conventional organic semiconductors is limited to reflection-type displays and top-emission-type light emission displays in which pixel electrodes are formed on TFTs.

The thin-film transistor of JP-A-2007-81362 (corresponding to US2007/0057261A1) does not provide an advantage of reduction in manufacturing cost because a transparent semiconductor layer is formed by vacuum film formation and photolithography like an amorphous silicon layer.

In JP-A-2003-508807 (corresponding to WO01/17029A1), a TFT is formed by patterning an organic polymer semiconductor layer by a printing technology. However, since the mobility of the organic semiconductor is low, the ratio W/L of the channel width W to the channel length L needs to be set large and interdigital electrodes are used. Furthermore, since microprocessing cannot be performed by the printing technology, the dimensions L and W need to be designed large and a large area is necessary for device formation.

In JP-A-2007-88001, a TFT is formed by patterning an organic polymer semiconductor by an ink-jet technology. The accuracy of the dimension W is increased by setting the printing direction so as to minimize the characteristic variations due to low patterning accuracy. However, since the channel length L, which has larger influence on the characteristic variations, is determined by photolithography, very large characteristic variations are unavoidable in the case where the semiconductor layer is formed by printing.

The present invention has been made in the above circumstances, and an object of the invention is therefore to provide a semiconductor device capable of suppressing the drain current characteristic variation that would otherwise be caused by low dimensional accuracy at the time of manufacture using a printing technology, as well as a manufacturing method of such a semiconductor device and a display device using such a semiconductor device.

The above object of the invention is attained by the following configurations and procedures:

(1) A semiconductor device comprising a substrate and a channel region which is formed above the substrate by printing, wherein:

a relationship $L \geq 2a$ is satisfied where L is a channel length of the channel region and a is a minimum dimension among pattern dimensions and inter-pattern dimensions in the same layer as patterns that define the channel length L; and a relationship $W \geq 2b$ is satisfied where W is a channel width of the channel region and b is a minimum dimension among pattern dimensions and inter-pattern dimensions in the same layer as a pattern that defines the channel width W.

(2) The semiconductor device according to item (1), wherein each of the minimum dimensions a and b is larger than or equal to 10 μm.

(3) The semiconductor device according to item (2), wherein a relationship $D=L(W+L)c/W(L^2-c^2) \leq 0.1$ is satisfied where D is a variation of W/L and c is a processing accuracy value of the patterns that define the channel length L and the pattern that defines the channel width W.

(4) The semiconductor device according to item (3), wherein the processing accuracy value c is larger than or equal to 2 μm.

(5) The semiconductor device according to item (3) or (4), wherein a relationship $D=L(W+L)c/W(L^2-c^2) \leq 0.05$ is satisfied.

(6) The semiconductor device according to any one of items (1) to (5), wherein mobility of a semiconductor layer where the channel region is formed is higher than or equal to 0.5 cm$^2$/V·s.

(7) The semiconductor device according to any one of items (1) to (5), wherein mobility of a semiconductor layer where the channel region is formed is higher than or equal to 10 cm$^2$/V·s.

(8) The semiconductor device according to any one of items (1) to (6), further comprising a gate insulating film formed above the substrate, wherein capacitance of the gate insulating film is smaller than or equal to 10 nF/cm$^2$.

(9) The semiconductor device according to any one of items (1) to (8), wherein the semiconductor layer contains an inorganic oxide.

(10) The semiconductor device according to item (9), wherein the inorganic oxide contains at least one of indium, zinc, gallium, tin, and aluminum.

(11) The semiconductor device according to any one of items (1) to (10), further comprising a light absorption layer disposed on a light incidence side of the channel region, for absorbing at least part of light having a wavelength range of 400 nm or less.

(12) The semiconductor device according to item (11), wherein the light absorption layer also serves as at least one of the substrate and a polarizing plate.

(13) A display device comprising the semiconductor device according to any one of items (1) to (12).

(14) A manufacturing method of a semiconductor device comprising a substrate and a channel region which is formed above the substrate by printing, wherein:

a relationship $L \geq 2a$ is satisfied where L is a channel length of the channel region and a is a minimum dimension among pattern dimensions and inter-pattern dimensions in the same layer as patterns that define the channel length L; and a relationship $W \geq 2b$ is satisfied where W is a channel width of the channel region and b is a minimum dimension among pattern dimensions and inter-pattern dimensions in the same layer as a pattern that defines the channel width W.

(15) The manufacturing method of a semiconductor device according to item (14), wherein at least one of a semiconductor layer where the channel region is formed and the patterns that define the channel length L is formed by ink-jet printing.

(16) The manufacturing method of a semiconductor device according to item (14) or (15), wherein each of the minimum dimensions a and b is larger than or equal to 10 μm.

(17) The manufacturing method of a semiconductor device according to item (16), wherein a relationship $D=L(W+L)c/W(L^2-c^2) \leq 0.1$ is satisfied where D is a variation of W/L and c is a processing accuracy value of the patterns that define the channel length L and the pattern that defines the channel width W.

(18) The manufacturing method of a semiconductor device according to item (17), wherein the processing accuracy value c is larger than or equal to 2 μm and a relationship $D=L(W+L)c/W(L^2-c^2) \leq 0.05$ is satisfied.

(19) The manufacturing method of a semiconductor device according to any one of items (14) to (18), wherein mobility of a semiconductor layer where the channel region is formed is higher than or equal to 0.5 cm$^2$/V·s.

(20) The manufacturing method of a semiconductor device according to any one of items (14) to (18), wherein mobility of a semiconductor layer where the channel region is formed is higher than or equal to 10 cm$^2$/V·s.

(21) The manufacturing method of a semiconductor device according to any one of items (14) to (20), wherein a gate insulating film is formed above the substrate so that capacitance of the gate insulating film is smaller than or equal to 10 nF/cm$^2$.

(22) The manufacturing method of a semiconductor device according to any one of items (14) to (21), wherein the semiconductor layer contains an inorganic oxide.

(23) The manufacturing method of a semiconductor device according to item (22), wherein the inorganic oxide contains at least one of indium, zinc, gallium, tin, and aluminum.

(24) The manufacturing method of a semiconductor device according to any one of items (14) to (23), wherein a light absorption layer for absorbing at least part of light having a wavelength range of 400 nm or less is formed on a light incidence side of the channel region.

(25) The manufacturing method of a semiconductor device according to item (24), wherein the light absorption layer also serves as at least one of the substrate and a polarizing plate.

The invention can provide a semiconductor device capable of suppressing the drain current characteristic variation that would otherwise be caused by low dimensional accuracy at the time of manufacture using a printing technology, as well as a manufacturing method of such a semiconductor device and a display device using such a semiconductor device.

DETAILED DESCRIPTION OF THE INVENTION

An embodiment of the present invention will be hereinafter described in detail with reference to the drawings.

Figure 1:
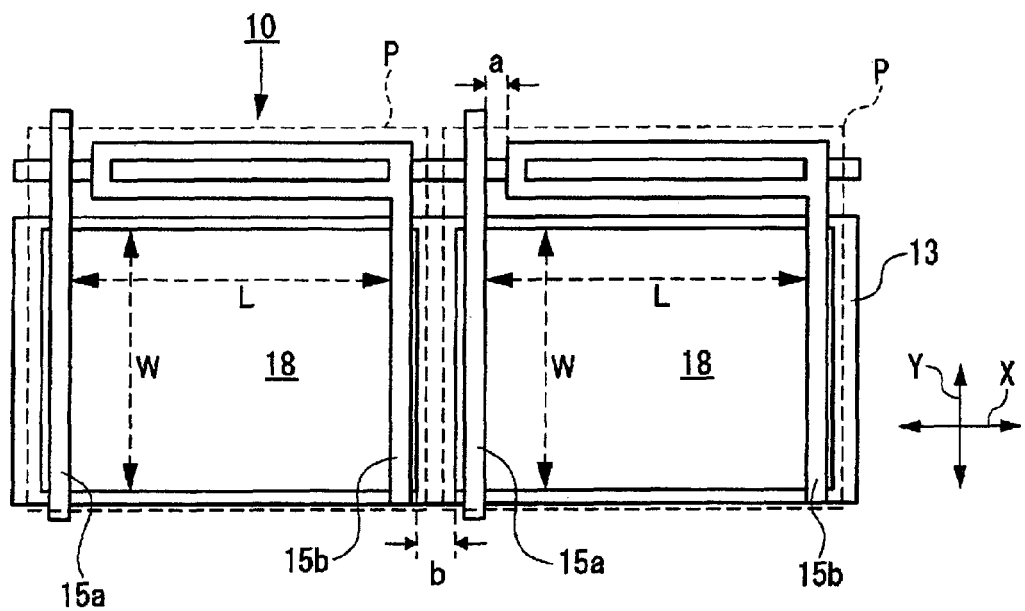
FIG. 1 is a plan view showing the configuration of a semiconductor device according to the present invention.
Figure 2:
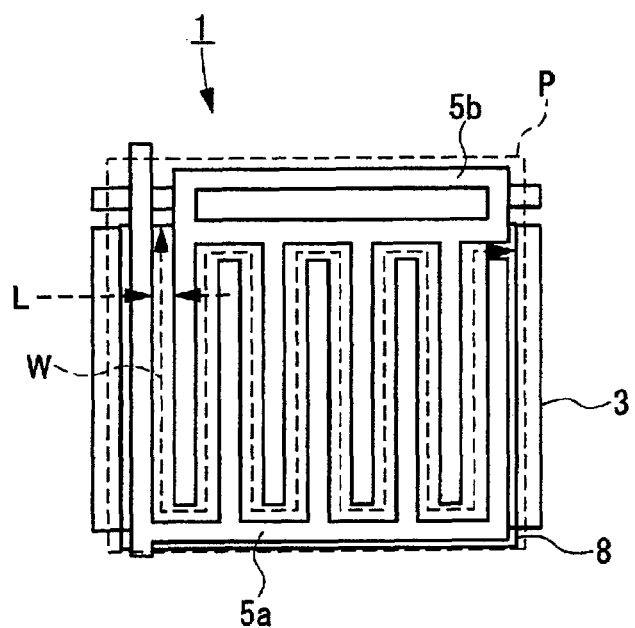
FIG. 2 is a plan view showing an example configuration of a common semiconductor device.

FIG. 1 is a plan view showing the configuration of a semiconductor device according to the invention. FIG. 2 is a plan view showing an example configuration of a conventional semiconductor device.

Plural pixel forming regions P are arranged in matrix form on a transparent substrate such as a glass substrate and a TFT element which is a semiconductor device 10 according to the embodiment is formed in each pixel forming region P.

A common gate electrode layer 13 is formed in pixel forming regions P on the same gate bus line among the plural pixel forming regions P arranged in matrix form. A semiconductor layer 18 is formed on the gate electrode layer 13 in each pixel forming region P. The semiconductor layer 18 is made of an inorganic oxide and patterned by printing as described later.

A source electrode layer 15a and a drain electrode layer 15b are formed in prescribed patterns on the semiconductor layer 18. The source electrode layer 15a and the drain electrode layer 15b may be made of a transparent electrode material and be pattern layers formed by the same patterning. A channel region of the semiconductor layer 18 is defined in a plan view (FIG. 1) by forming pattern layers including the source electrode layer 15a and the drain electrode layer 15b. In this embodiment, the interval between the source electrode layer 15a and the drain electrode layer 15b in the X direction in FIG. 1 is a channel length L (the length of a portion of the active layer). The channel length L is set so as to satisfy a relationship $L \geq 2a$ where a is a minimum dimension among pattern dimensions and inter-pattern dimensions in the same layer where the source electrode layer 15a and the drain electrode layer 15b are formed.

On the other hand, in the embodiment, the dimension of the semiconductor layer 18 in the Y direction is a channel width W. A dimension b is defined as a minimum dimension among pattern dimensions and inter-pattern dimensions in the same layer where the semiconductor layer 18 is formed. In the embodiment, the minimum dimension b is the interval between the semiconductor layers 18 in adjoining pixel forming regions P. The channel width W is set so as to satisfy a relationship $W \geq 2b$.

The invention is more effective if the minimum dimension a relating to the patterns that define the channel length L is larger than or equal to 10 μm and the minimum dimension b relating to the pattern that defines the channel width W is larger than or equal to 10 μm.

In the conventional semiconductor device 1 of FIG. 2 which is formed by using an organic semiconductor material, a source electrode layer 5a and a drain electrode layer 5b are formed in the same layer on an organic semiconductor layer 3 in each pixel forming region P. In the semiconductor device 1 of FIG. 2, the channel length L is equal to a minimum dimension in the layer in which the source electrode layer 5a and the drain electrode layer 5b are formed and the channel width W is long relative to the channel length L. This is because, in general, organic semiconductors have as small mobility values as 0.01 to 0.1 cm²/V·s and to obtain a sufficient drive current the ratio W/L of the channel width W to the channel length L needs to be set large.

In the semiconductor 10 according to the embodiment, it is preferable that a relationship $D=L(W+L)c/W(L^2-c^2) \leq 0.1$ be satisfied where c is the processing accuracy value of the patterns that define the channel length L and the pattern that defines the channel width W and D is the variation of the ratio W/L of the channel width W to the channel length L. This means that the variation D of the ratio W/L of the channel width W to the channel length L is within 10%. It is also preferable that a relationship $D=L(W+L)c/W(L^2-c^2) \leq 0.05$ be satisfied in the case where the processing accuracy value c be larger than or equal to 2 μm. The invention is particularly effective in the case where the processing accuracy value c is as very large (accuracy is very low) as 2 μm or more. For example, the processing accuracy value c is expressed by using standard deviations σ of channel lengths L and channel widths W of plural semiconductor devices produced. Where more importance is attached to the uniformity, 3σ or the like may be used.

As is apparent from the comparison with the conventional semiconductor device 1 of FIG. 2, in the case where patterns of the source electrode layer 15a, the drain electrode layer 15b, and the semiconductor layer 18 are formed by printing, the drain current variation of the semiconductor device 10 of FIG. 1 can be suppressed by setting the channel length L greater than two times the minimum dimension a relating to the patterns of the source electrode layer 15a and the drain electrode layer 15b and setting the channel width W greater than two times the minimum dimension b relating to the pattern of the semiconductor layer 18. In contrast, in the semiconductor device 1 of FIG. 2, since the channel length L is equal to the minimum dimension in the layer where the source electrode layer 5a and the drain electrode layer 5b are formed, it is affected to a large extent by variations occurring in a printing step. It is therefore unavoidable that the drain current characteristic variation at the time of driving of the semiconductor device 1 becomes large.

Figure 3:
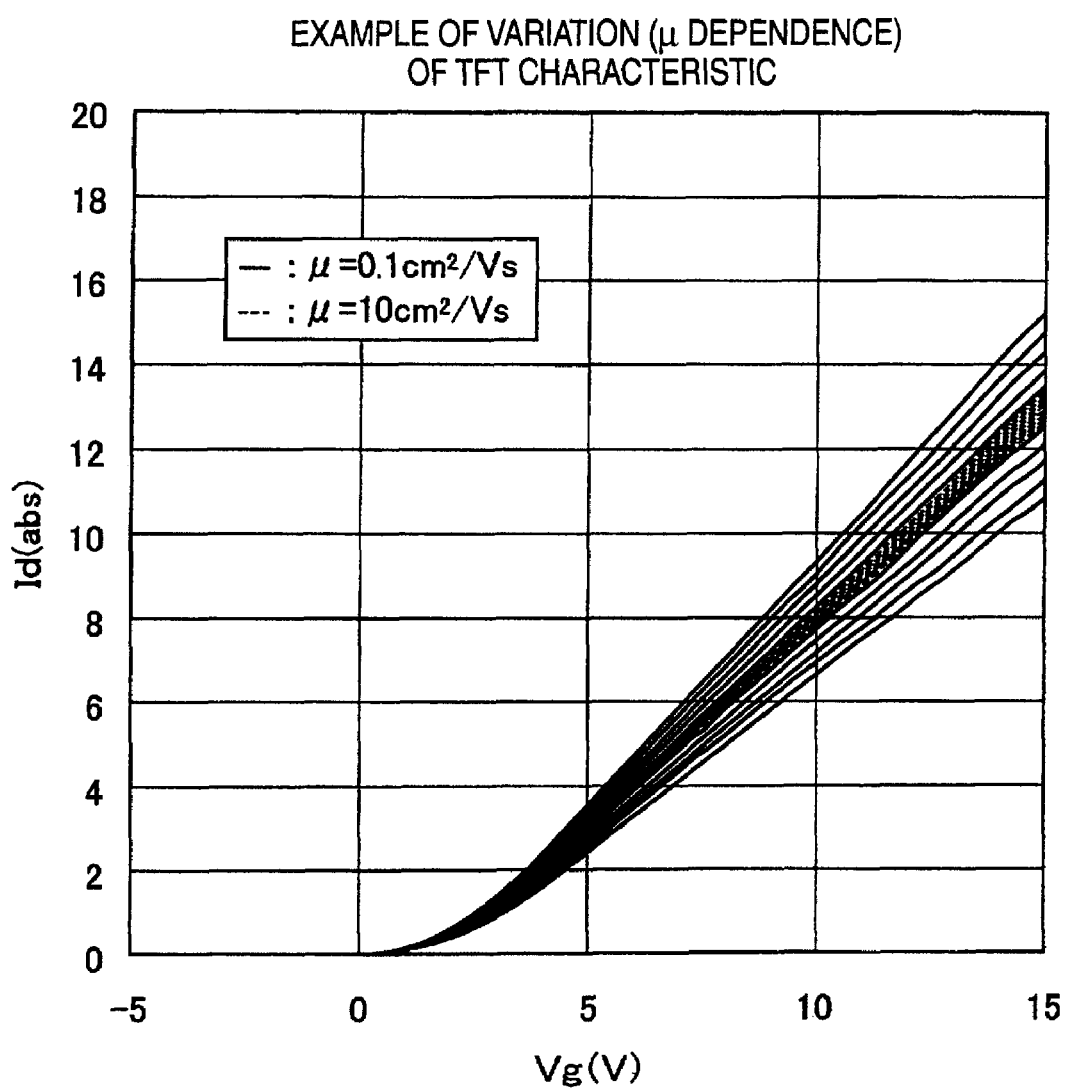
FIG. 3 is a graph showing examples of a TFT characteristic that depends on the mobility of a semiconductor layer.

FIG. 3 is a graph showing example TFT characteristics of semiconductor devices that were produced by a printing technology in such a manner that both minimum dimensions a and b were set at 15 μm and the processing accuracy value c was set at 2.5 μm (this TFT characteristic depends on the mobility of the semiconductor layer). In FIG. 3, the horizontal axis represents the gate voltage Vg and the vertical axis represents the drain current Id. Solid-line curves represent characteristics of semiconductor devices using an organic semiconductor layer (mobility μ: 0.1 cm²/V·s) and broken-line curves represent characteristics of semiconductor devices using an inorganic oxide semiconductor layer (mobility μ: 10 cm²/V·s) according to the embodiment. As seen from FIG. 3, the drain current varies to a very large extent (about 17%) in the case where the mobility μ is 0.1 cm²/V·s. The drain current variation in the case that the mobility μ is 10 cm²/V·s is smaller than in the case that the mobility μ is 0.1 cm²/V·s and is as small as about 2.5%. It is understood from this result that the semiconductor layer made of an inorganic oxide which exhibits high mobility can suppress the drain current variation more than the semiconductor layer made of an organic semiconductor layer.

As such, the semiconductor device according to the embodiment in which the semiconductor layer contains an inorganic oxide can suppress the drain current variation by changing the drive voltage during driving. It is preferable that the mobility of the semiconductor layer be higher than or equal to 0.5 cm²/V·s, and it is even preferable that the mobility of the semiconductor layer be higher than or equal to 10 cm²/V·s.

It is preferable that the inorganic oxide contains at least one of indium, zinc, gallium, tin, and aluminum.

Figure 4:
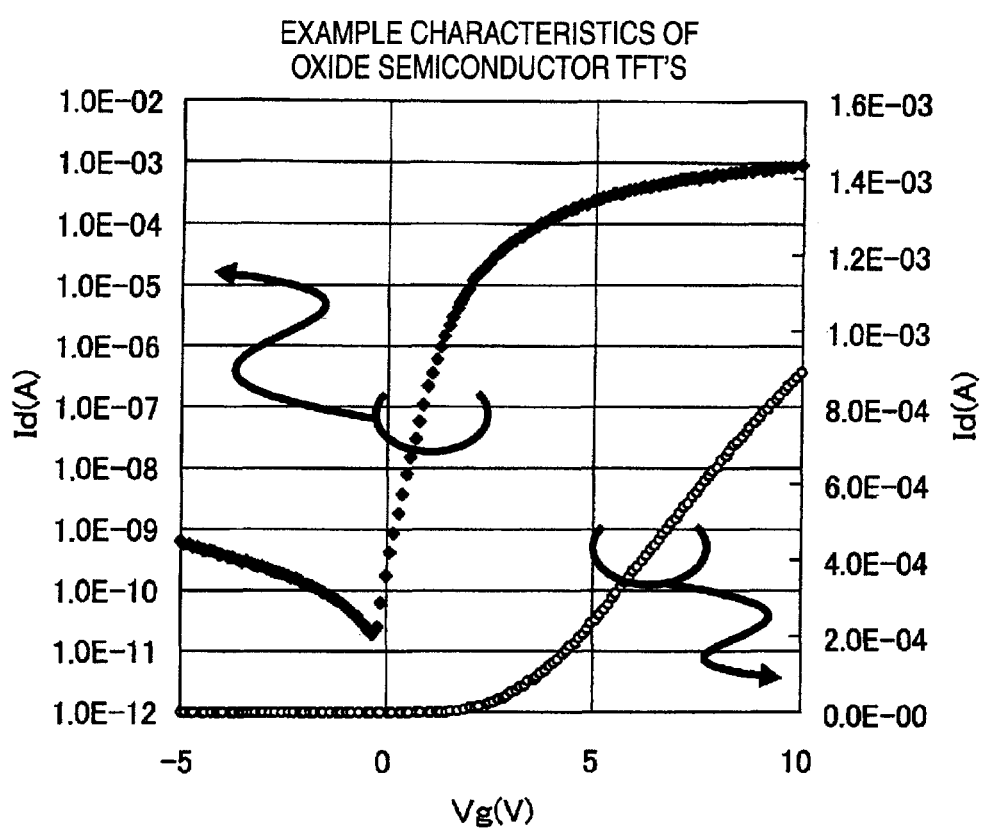
FIG. 4 is a graph showing example characteristics of TFTs using an oxide semiconductor.

FIG. 4 is a graph showing example characteristics of TFTs using an oxide semiconductor. In FIG. 4, the horizontal axis represents the gate voltage Vg and the vertical axis represents the drain current Id.

Next, a description will be made of an example that the semiconductor device according to the embodiment is applied to a transmission-type display. The application range of the semiconductor device according to the invention is not limited to the display device having the following configuration and encompasses other bottom-emission-type light-emission displays etc.

Figure 5:
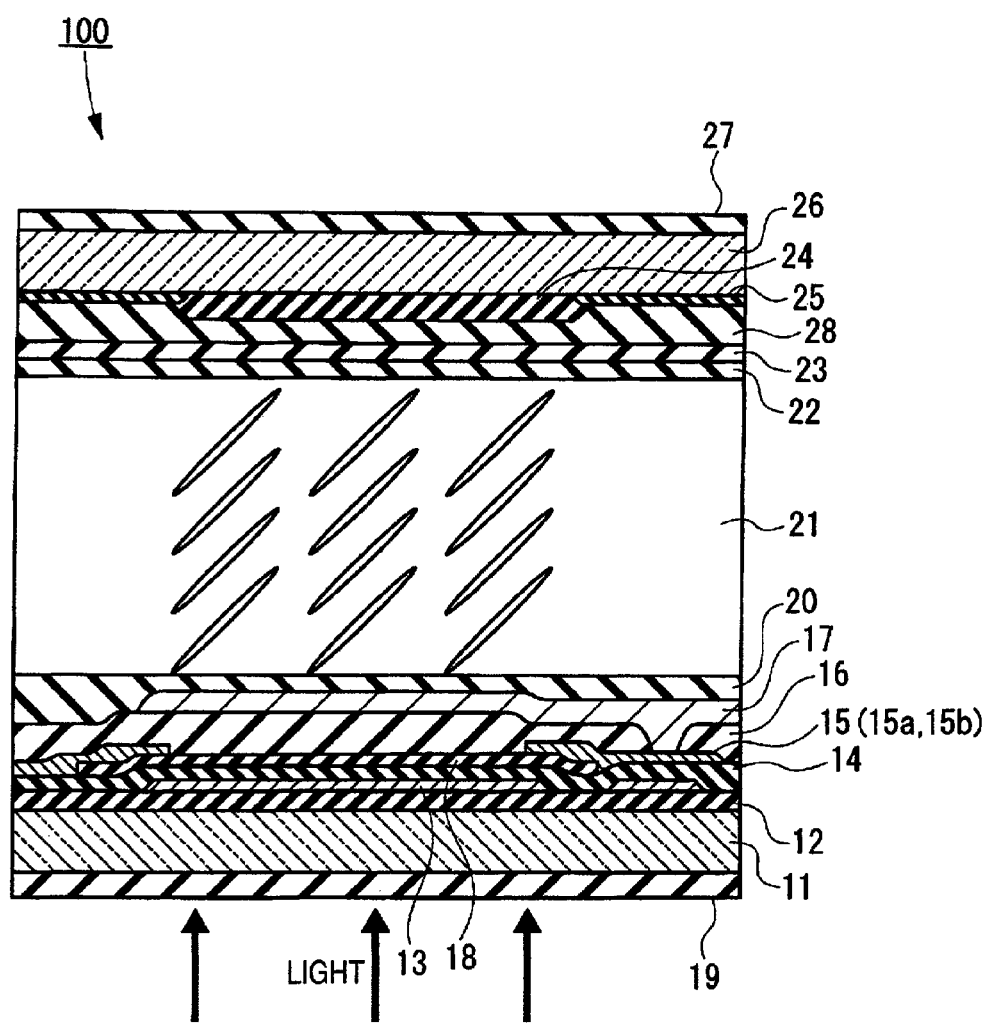
FIG. 5 is a sectional view showing the configuration of a display device.

FIG. 5 is a sectional view showing the configuration of a display device. It is assumed that light coming from a light source enters the display device 100 of FIG. 5 from below. In the following description which will be made with reference to FIG. 5, the terms "top" and "bottom" have meanings as viewed in FIG. 5. The "top surface" means the surface opposite to the light-incidence-side surface and the "bottom surface" means the light-incidence-side surface.

A transparent insulating layer 12 is formed on a light-incidence-side, transparent glass substrate 11 and a gate electrode 13 is formed in a prescribed pattern in each pixel forming region. A gate insulating film 14 is formed so as to cover the gate electrode 13. A semiconductor layer 18 made of an inorganic oxide is formed in a prescribed pattern on the top surface of the gate insulating film 14 in a region that is located over the underlying gate electrode 13.

Electrode layers 15 including a source electrode layer 15a and a drain electrode layer 15b are formed so as to be laid on parts of the semiconductor layer 18. An interlayer insulating film 16 is formed on the top surfaces of the electrode layers 15 and a pixel electrode 17 is formed on the interlayer insulating film 16. The pixel electrode 17 is formed in such a manner that at least part of it is in contact with and hence is electrically continuous with the drain electrode layer 15b.

A bottom alignment film 20, a top alignment film 22, and a liquid crystal layer 21 are formed on the pixel electrode 17. The liquid crystal layer 21 is disposed between the pair of alignment films 20 and 22. A transparent counter electrode 23 is formed on the top surface of the top alignment film 22 so as to be opposed to the pixel electrode 17 in the top-bottom direction. A planarization film 28 is formed on the counter electrode 23, and a color filter 24 and an opaque black matrix 25 are arranged on the top surface of the planarization film 28. A transparent glass substrate 26 is disposed on the color filter 24. A polarizing plate 27 is disposed on the top surface of the glass substrate 26.

In the embodiment, a polarizing plate 19 is disposed on the bottom surface of the light-incidence-side glass substrate 11. At least one of the substrate 11 and the polarizing plate 19 may also serve as a light absorption layer for absorbing at least part of light having a wavelength range is 400 nm or less.

In the above display device, even in the case where the semiconductor layer of each pixel forming region is formed by printing, the drain current characteristic variation at the time of driving can be reduced by suppressing dimensional variations in a printing step. In addition, the use of printing enables cost reduction. Furthermore, since the semiconductor layer is transparent in the visible range, the channel region can be caused to transmit light by forming the gate electrode 13 and the pixel electrode 17 with a transparent material. Since a sufficient aperture ratio can be secured even in a configuration in which the device forming region occupies most of the pixel forming region, application to transmission-type displays and bottom-emission-type light emission displays is made possible.

Next, a manufacturing procedure of the semiconductor device according to the embodiment will be described with reference to the drawings. In the following description, members etc. that are substantially the same in structure and workings as already described members etc. will be given the same reference numerals as the latter in the drawings and their descriptions will be simplified or omitted.

FIGS. 6A-6F are sectional views showing the manufacturing procedure of the semiconductor device.

Figure 6A:
FIGS. 6A-6F are sectional views showing a manufacturing procedure of the semiconductor device.

First, as shown in FIG. 6A, a transparent gate electrode 13 of ITO, IZO, GZO, or the like is formed on a substrate 11 (e.g., a glass substrate or a film substrate made of PET, PEN, PES, or the like) by a printing technology such as ink-jet printing or screen printing.

Figure 6B:
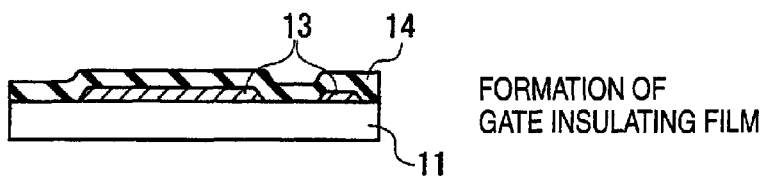

Then, as shown in FIG. 6B, a transparent gate insulating film 14 is formed on the top surface of the substrate 11 so as to cover the gate electrode 13. More specifically, a transparent gate insulating film 14 of $SiO_2$, $SiN_x$, $Al_2O_3$, $Y_2O_3$, or the like is formed by a printing technology such as ink-jet printing or screen printing. To attain good display characteristics by reducing the drain/gate parasitic capacitance, it is preferable that the capacitance of the gate insulating film 14 be smaller than or equal to 10 $nF/cm^2$. In the embodiment, when a 500-nm-thick $SiO_2$ film was formed as the gate insulating film 14, the capacitance per unit area was 7.1 $nF/cm^2$. As shown in FIG. 5, an insulating layer 12 of $SiN_x$, $SiON_x$, or the like may be formed above the substrate 11 as a gas barrier layer, a heat barrier layer, or an ultraviolet cutting layer.

Figure 6C:
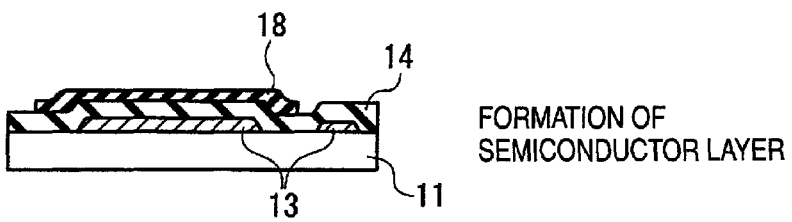

As shown in FIG. 6C, an island pattern of a semiconductor layer 18 which is a thin film of a transparent oxide such as IGZO ($InGaZnO_4$) or ZnO is formed by a printing technology such as ink-jet printing or screen printing. The semiconductor layer 18 is formed so that the channel width W and the minimum dimension b satisfy the relationship $W \geq 2b$ in a plan view (see FIG. 1). The oxide semiconductor thin film may be either an amorphous film or a crystalline film, and may be annealed by heat, laser light, or the like to make it functional.

Figure 6D:
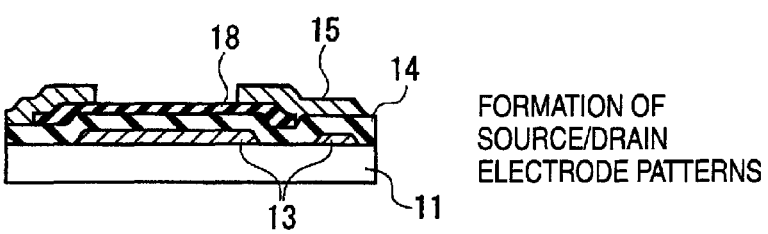

As shown in FIG. 6D, electrode layers 15 (source electrode and drain electrode) are formed with a metal paste or the like by a printing technology such as ink-jet printing or screen printing. The electrode layers 15 (source electrode and the drain electrode) are formed so that the channel length L and the minimum dimension a satisfy the relationship $L \geq 2a$.

For example, an Ag or Au nano-particle dispersion liquid can be used as the metal paste. This layer may also be made of a transparent conductor such as ITO as long as there is no problem in wiring resistance etc.

Figure 6E:
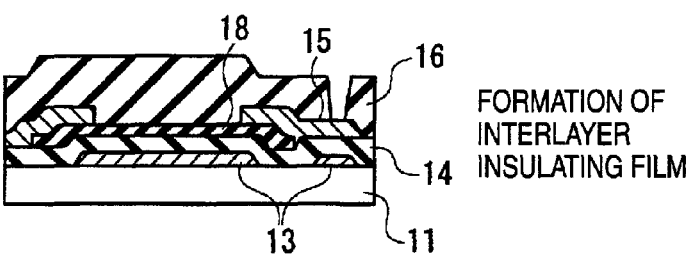
Figure 6F:
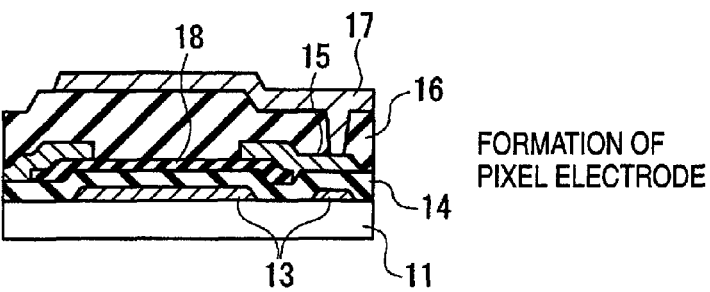

After an interlayer insulating film 16 is formed as shown in FIG. 6E, a pixel electrode 17 is formed on the interlayer insulating film 16 in such a manner that at least part of it is connected to the drain electrode layer (see FIG. 6F). Subsequent steps are executed by using ordinary process technologies, whereby a transmission-type LCD is completed.

More specifically, a transparent insulating layer of $SiN_x$, PI, or the like and a transparent pixel electrode of ITO, IZO, or the like are formed by a printing technology such as ink-jet printing or screen printing. The mobility μ of a resulting TFT was 12 $cm^2/V \cdot s$, which is 120 times the value (0.1 $cm^2/V \cdot s$) of common organic semiconductors. The minimum dimension that can be attained by the ink-jet printing used for the pattern formation was 15 μm and its dimensional accuracy was ±2.5 μm. When a device whose dimensions L and W were 240 μm and 200 μm, respectively, was formed in a pixel forming region of 300 $μm^2$, the drain current variation was suppressed to within 3%.

In the invention, the gate electrode, the semiconductor layer, and the pixel electrode are transparent to visible light and light coming from a backlight is output through those layers. This configuration can be applied to such displays as bottom-emission-type organic EL (OLED: organic light-emitting diode) displays in addition to transmission-type LCDs. In the semiconductor layer, there are no absorptions in the visible range and hence almost no leak current is caused by illumination with light. However, where the wavelength of a light source extends to an ultraviolet range and the light includes a component whose energy is higher than the band gap of the semiconductor layer, such a component may be shut off by the substrate, polarizing film, ultraviolet cutting layer, gate electrode, or some other member.

The invention is not limited to the above embodiment and can be modified or improved properly.

For example, although the semiconductor device according to the embodiment has what is called a bottom-gate configuration in which the gate electrode is disposed on the substrate side, the invention can also be applied to what is called a top-gate-type configuration in which the gate electrode is disposed on the side opposite to the substrate.

The application range of the semiconductor device according to the invention is not limited to display devices and encompasses semiconductor sensors.

What is claimed is:

1. A semiconductor device comprising a substrate and a channel region which is formed above the substrate by printing, wherein:
    a relationship $L \geq 2a$ is satisfied where L is a channel length of the channel region and a is a minimum dimension among pattern dimensions and inter-pattern dimensions in the same layer as patterns that define the channel length L; and
    a relationship $W \geq 2b$ is satisfied where W is a channel width of the channel region and b is a minimum dimension among pattern dimensions and inter-pattern dimensions in the same layer as a pattern that defines the channel width W.

2. The semiconductor device according to claim 1, wherein each of the minimum dimensions a and b is larger than or equal to 10 μm.

3. The semiconductor device according to claim 2, wherein a relationship $D=L(W+L)c/W(L^2-c^2) \leqq 0.1$ is satisfied where D is a variation of W/L and c is a processing accuracy value of the patterns that define the channel length L and the pattern that defines the channel width W.

4. The semiconductor device according to claim 3, wherein the processing accuracy value c is larger than or equal to 2 μm.

5. The semiconductor device according to claim 3, wherein a relationship $D=L(W+L)c/W(L^2-c^2) \leqq 0.05$ is satisfied.

6. The semiconductor device according to claim 1, wherein mobility of a semiconductor layer where the channel region is formed is higher than or equal to 0.5 cm$^2$/V·s.

7. The semiconductor device according to claim 1, wherein mobility of a semiconductor layer where the channel region is formed is higher than or equal to 10 cm$^2$/V·s.

8. The semiconductor device according to claim 1, further comprising a gate insulating film formed above the substrate, wherein capacitance of the gate insulating film is smaller than or equal to 10 nF/cm$^2$.

9. The semiconductor device according to claim 1, wherein the semiconductor layer comprises an inorganic oxide.

10. The semiconductor device according to claim 9, wherein the inorganic oxide comprises at least one of indium, zinc, gallium, tin, and aluminum.

11. The semiconductor device according to claim 9, further comprising a light absorption layer disposed on a light incidence side of the channel region, for absorbing at least part of light having a wavelength range of 400 nm or less.

12. The semiconductor device according to claim 11, wherein the light absorption layer also serves as at least one of the substrate and a polarizing plate.

13. A display device comprising the semiconductor device according to claim 1.

14. A manufacturing method of a semiconductor device comprising a substrate and a channel region which is formed above the substrate by printing, wherein:
a relationship $L \geqq 2a$ is satisfied where L is a channel length of the channel region and a is a minimum dimension among pattern dimensions and inter-pattern dimensions in the same layer as patterns that define the channel length L; and
a relationship $W \geqq 2b$ is satisfied where W is a channel width of the channel region and b is a minimum dimension among pattern dimensions and inter-pattern dimensions in the same layer as a pattern that defines the channel width W.

15. The manufacturing method of a semiconductor device according to claim 14, wherein at least one of a semiconductor layer where the channel region is formed and the patterns that define the channel length L is formed by ink-jet printing.

16. The manufacturing method of a semiconductor device according to claim 14, wherein each of the minimum dimensions a and b is larger than or equal to 10 μm.

17. The manufacturing method of a semiconductor device according to claim 16, wherein a relationship $D=L(W+L)c/W(L^2-c^2) \leqq 0.1$ is satisfied where D is a variation of W/L and c is a processing accuracy value of the patterns that define the channel length L and the pattern that defines the channel width W.

18. The manufacturing method of a semiconductor device according to claim 17, wherein the processing accuracy value c is larger than or equal to 2 μm and a relationship $D=L(W+L)c/W(L^2-c^2) \leqq 0.05$ is satisfied.

19. The manufacturing method of a semiconductor device according to claim 14, wherein mobility of a semiconductor layer where the channel region is formed is higher than or equal to 0.5 cm$^2$/V·s.

20. The manufacturing method of a semiconductor device according to claim 14, wherein mobility of a semiconductor layer where the channel region is formed is higher than or equal to 10 cm$^2$/V·s.

21. The manufacturing method of a semiconductor device according to claim 14, wherein a gate insulating film is formed above the substrate so that capacitance of the gate insulating film is smaller than or equal to 10 nF/cm$^2$.

22. The manufacturing method of a semiconductor device according to claim 14, wherein the semiconductor layer comprises an inorganic oxide.

23. The manufacturing method of a semiconductor device according to claim 22, wherein the inorganic oxide comprises at least one of indium, zinc, gallium, tin, and aluminum.

24. The manufacturing method of a semiconductor device according to claim 22, wherein a light absorption layer for absorbing at least part of light having a wavelength range of 400 nm or less is formed on a light incidence side of the channel region.

25. The manufacturing method of a semiconductor device according to claim 24, wherein the light absorption layer also serves as at least one of the substrate and a polarizing plate.

* * * * *